(12) United States Patent
Tabuchi et al.

(10) Patent No.: US 11,183,387 B2
(45) Date of Patent: Nov. 23, 2021

(54) SEMICONDUCTOR DEVICE, SEMICONDUCTOR WAFER AND METHOD FOR MANUFACTURING SEMICONDUCTOR DEVICE

(71) Applicant: Mitsubishi Electric Corporation, Tokyo (JP)

(72) Inventors: Shinichi Tabuchi, Tokyo (JP); Yasuo Ata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/770,443

(22) PCT Filed: Apr. 11, 2018

(86) PCT No.: PCT/JP2018/015271
§ 371 (c)(1),
(2) Date: Jun. 5, 2020

(87) PCT Pub. No.: WO2019/198182
PCT Pub. Date: Oct. 17, 2019

(65) Prior Publication Data
US 2021/0166944 A1    Jun. 3, 2021

(51) Int. Cl.
*H01L 27/06*     (2006.01)
*H01L 21/22*     (2006.01)
(Continued)

(52) U.S. Cl.
CPC ........ *H01L 21/221* (2013.01); *H01L 21/2215* (2013.01); *H01L 22/14* (2013.01);
(Continued)

(58) Field of Classification Search
None
See application file for complete search history.

(56) References Cited

U.S. PATENT DOCUMENTS 5,850,088 A    12/1998  Aono
8,659,052 B2 *  2/2014  Ikeda .................... H01L 21/02
                                                           257/140

(Continued)

FOREIGN PATENT DOCUMENTS

JP    H10178079 A      6/1998
JP    H11054583 A      2/1999
JP    2013201206 A    10/2013

OTHER PUBLICATIONS

International Search Report; Written Opinion; and Notification of Transmittal of The International Search Report and the Written Opinion of the International Searching Authority, or the Declaration issued in PCT/JP2018/015271; dated Jul. 3, 2018.

*Primary Examiner* — Ali Naraghi
(74) *Attorney, Agent, or Firm* — Studebaker & Brackett PC

(57) ABSTRACT

A semiconductor device according to the present disclosure includes a semiconductor substrate having an effective region and an ineffective region, an upper surface electrode layer provided on an upper surface of the semiconductor substrate and a rear surface electrode layer provided on a rear surface of the semiconductor substrate, wherein the semiconductor substrate includes a lifetime control layer that is provided in the effective region, a measurement layer provided at an upper surface side of the ineffective region and a crystal defect layer that is provided in the ineffective region, the upper surface electrode layer includes a plurality of measurement electrodes provided on the measurement layer, the measurement layer includes a conducting layer at least at a portion where the plurality of measurement electrodes are provided, and the crystal defect layer is provided between the plurality of measurement electrodes.

14 Claims, 4 Drawing Sheets

(51) Int. Cl.
  *H01L 21/66* (2006.01)
  *H01L 29/10* (2006.01)
  *H01L 29/16* (2006.01)
  *H01L 29/20* (2006.01)
  *H01L 29/32* (2006.01)
  *H01L 29/739* (2006.01)
  *H01L 29/861* (2006.01)

(52) U.S. Cl.
  CPC .......... *H01L 22/32* (2013.01); *H01L 27/0664* (2013.01); *H01L 29/1095* (2013.01); *H01L 29/1602* (2013.01); *H01L 29/1608* (2013.01); *H01L 29/2003* (2013.01); *H01L 29/32* (2013.01); *H01L 29/7397* (2013.01); *H01L 29/8613* (2013.01)

(56) References Cited

U.S. PATENT DOCUMENTS

| | | | |
|---|---|---|---|
| 9,620,499 B2 * | 4/2017 | Hirabayashi | H01L 29/66348 |
| 10,014,368 B2 * | 7/2018 | Iwasaki | H01L 29/6609 |
| 2012/0132955 A1 * | 5/2012 | Saito | H01L 29/7397 257/140 |
| 2013/0249063 A1 | 9/2013 | Shibata et al. | |
| 2018/0012762 A1 * | 1/2018 | Mukai | H01L 29/36 |

\* cited by examiner

SEMICONDUCTOR DEVICE, SEMICONDUCTOR WAFER AND METHOD FOR MANUFACTURING SEMICONDUCTOR DEVICE

FIELD

The present invention relates to a semiconductor device, a semiconductor wafer and a method for manufacturing a semiconductor device

BACKGROUND

PTL 1 discloses a TEG (Test Element Group) for lifetime evaluation and an evaluation method that enable direct evaluation of a lifetime of a carrier of a wafer product. According to the evaluation method of PTL 1, a lifetime value is estimated by comparing on-voltage values given by measurement of an actual TEG with on-voltage values given by simulation.

CITATION LIST

Patent Literature

[PTL 1] JP H10-178079 A

SUMMARY

Technical Problem

To manufacture a semiconductor device, a variety of monitor units may be formed on a wafer for a purpose of product management. Meanwhile, carrier lifetime is usually an important factor related to various characteristics of a power device. In this regard, in a case where the lifetime is to be evaluated in a final process of manufacturing processes, it is of concern that prompt feedback is difficult. Further, a typical lifetime evacuation method may include measuring a certain characteristic value derived by integrally including a plurality of production parameters or a substitute value. In this case, evaluation accuracy is likely to be difficult to improve.

The TEG of PTL 1 enables measurement of characteristics of a lifetime control layer itself. However, in PTL 1, since a product itself is processed, characteristics of the product are likely to be affected. In addition, since the lifetime value is obtained by simulation, it is likely to take time before a result is available. For this reason, the TEG may be difficult to use for inspection of characteristics of a mass-produced product. Further, in a case where easy control of a depth of proton irradiation is desired, the TEG is likely to be unsuitable.

The present invention has been made to solve the above problems and an object thereof is to provide a semiconductor device, a semiconductor wafer and a method for manufacturing a semiconductor device that enable easily determining a depth of a lifetime control layer.

Solution to Problem

A semiconductor device according to the present invention includes a semiconductor substrate having an effective region where principle current is to flow and an ineffective region that surrounds the effective region, an upper surface electrode layer provided on an upper surface of the semiconductor substrate and a rear surface electrode layer provided on a rear surface of the semiconductor substrate, wherein the semiconductor substrate includes a lifetime control layer that is provided in the effective region and higher in crystal defect density than a surrounding thereof, a measurement layer provided at an upper surface side of the ineffective region and a crystal defect layer that is provided in the ineffective region and higher in crystal defect density than a surrounding thereof, the upper surface electrode layer includes a plurality of measurement electrodes provided on the measurement layer, the measurement layer includes a conducting layer at least at a portion where the plurality of measurement electrodes are provided, and the crystal defect layer is provided between the plurality of measurement electrodes as viewed from a direction orthogonal to the upper surface of the semiconductor substrate.

A method for manufacturing a semiconductor device according to the present invention includes forming, in a semiconductor substrate, an effective region where principle current is to flow and an ineffective region where a measurement layer is formed at an upper surface side thereof, the ineffective region surrounding the effective region, forming an upper surface electrode layer on an upper surface of the semiconductor substrate by forming a plurality of measurement electrodes on the measurement layer, forming a rear surface electrode layer on a rear surface of the semiconductor substrate, forming a mask on the upper surface electrode layer with a height of the mask from the upper surface of the semiconductor substrate on the measurement layer being higher than on the effective region, performing proton irradiation from above the mask, thereby forming a lifetime control layer in the effective region and forming a crystal defect layer between the plurality of measurement electrodes as viewed from a direction orthogonal to the upper surface of the semiconductor substrate; and removing the mask and measuring a resistance value between the plurality of measurement electrodes after the proton irradiation, wherein a conducting layer is formed in the measurement layer at least at a portion where the plurality of measurement electrodes are provided.

Advantageous Effects of Invention

In the semiconductor device according to the present invention, a resistance value or a current value of the measurement layer can be measured using the plurality of measurement electrodes. Further, proton injection is performed to form the crystal defect layer in the measurement layer when the lifetime control layer is formed at a target depth, for example. When the crystal defect layer is formed in the measurement layer, the resistance value or the current value of the measurement layer varies. The depth of the lifetime control layer can thus be easily determined from the resistance value or the current value of the measurement layer.

In the method for manufacturing a semiconductor device according to the present invention, the proton irradiation is performed from above the mask, thereby forming the lifetime control layer in the effective region and forming the crystal defect layer in, for example, the measurement layer in the ineffective region. When the crystal defect layer is formed in the measurement layer, the resistance value or the current value of the measurement layer varies. The depth of the lifetime control layer can thus be easily determined by measuring the resistance value or the current value of the measurement layer using the plurality of measurement electrodes.

DESCRIPTION OF EMBODIMENTS

Figure 1:
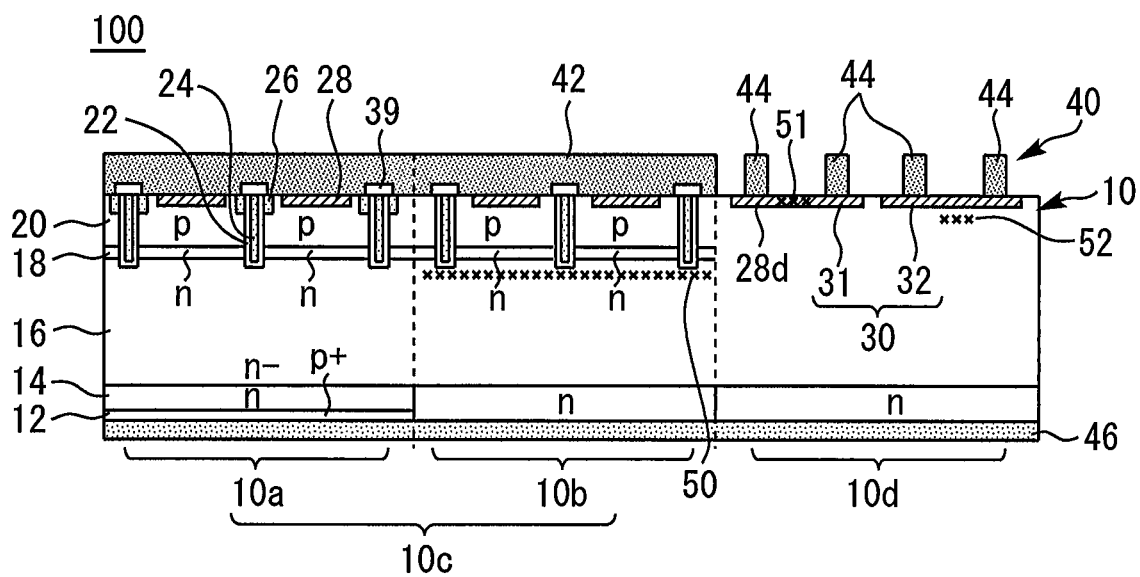
FIG. 1 is a cross-sectional view of a semiconductor device according to the first embodiment.

A semiconductor device, a semiconductor wafer and a method for manufacturing a semiconductor device according to an embodiment of the present invention are described with reference to drawings. Identical or corresponding constitutional elements are given the same reference numerals, and the repeated description of such constitutional elements may be omitted.

First Embodiment

FIG. 1 is a cross-sectional view of a semiconductor device 100 according to the first embodiment. The semiconductor device 100 includes a semiconductor substrate 10, an upper surface electrode layer 40 provided on an upper surface of the semiconductor substrate 10, a rear surface electrode layer 46 provided on a rear surface of the semiconductor substrate 10. The semiconductor substrate 10 has an effective region 10c where principle current is to flow and an ineffective region 10d that surrounds the effective region 10c.

The effective region 10c is a region with a circuit device that contributes to energization. The effective region 10c includes an IGBT (Insulated Gate Bipolar Transistor) region 10a and a diode region 10b. The semiconductor device 100 is an RC (Reverse-conducting)-IGBT.

The ineffective region 10d, which is a region other than the effective region 10c, is not provided with a circuit device. The ineffective region 10d may be a dicing line region.

In the IGBT region 10a, an n-type drift layer 16 is provided at an upper surface side of the semiconductor substrate 10. An n-type carrier storing layer 18 is provided at an upper surface side of the drift layer 16. A p-type base layer 20 is provided at an upper surface side of the carrier storing layer 18. A p-type diffusion layer 28 is provided at an upper surface side of the base layer 20. In the present embodiment, the n-type is a first conductivity type and the p-type is a second conductivity type. The present invention is not limited thereto and the p-type may be the first conductivity type and the n-type may be the second conductivity type.

Gate electrodes 24 are provided at both sides of the diffusion layer 28. The gate electrodes 24 are embedded in the semiconductor substrate 10. The gate electrodes 24 are exposed from the upper surface of the semiconductor substrate 10. Further, the gate electrodes 24 extend downward beyond an interface between the drift layer 16 and the carrier storing layer 18. The gate electrodes 24 are each covered by a gate insulating film 22. n-type emitter layers 26 are provided at both sides of each of the gate electrodes 24. The diffusion layer 28 is sandwiched between the emitter layers 26 with the base layer 20 in between.

An n-type buffer layer 14 is provided at a rear surface side of the semiconductor substrate 10. A collector layer 12 is provided at a rear surface side of the buffer layer 14.

A structure at the upper surface side of the semiconductor substrate 10 in the diode region 10b is similar to that in the IGBT region 10a except that no emitter layer 26 is provided. In the diode region 10b, the base layer 20 corresponds to an anode. Further, a structure at the rear surface side of the semiconductor substrate 10 in the diode region 10b is similar to that in the IGBT region 10a except that no collector layer 12 is provided. In the diode region 10b, the buffer layer 14 corresponds to a cathode.

In the ineffective region 10d, the drift layer 16, which is an n-type semiconductor layer, is provided at the upper surface side of the semiconductor substrate 10. A p-type conducting layer 28d is formed at the upper surface side of the drift layer 16. The conducting layer 28d is the same as the diffusion layer 28. A measurement layer 30 for determining a depth of a later-described lifetime control layer 50 is provided in the ineffective region 10d. The measurement layer 30 is provided at the upper surface side in the ineffective region 10d. The measurement layer 30 includes a first measurement layer 31 and a second measurement layer 32. Further, in the present embodiment, each of the first measurement layer 31 and the second measurement layer 32 is the conducting layer 28d.

A structure at the rear surface side of the semiconductor substrate 10 in the ineffective region 10d is similar to that in the diode region 10b.

In the effective region 10c, an insulating layer 39 is provided on each of the gate electrodes 24. Further, in the effective region 10c, the upper surface electrode layer 40 includes an emitter electrode 42 provided on the upper surface of the semiconductor substrate 10 and on the insulating layer 39. Further, the upper surface electrode layer 40 includes a plurality of measurement electrodes 44 provided on the measurement layer 30. Two of the measurement electrodes 44 are provided on the first measurement layer 31. Similarly, two of the measurement electrodes 44 are provided on the second measurement layer 32.

Further, the lifetime control layer 50 is provided in the diode region 10b of the effective region 10c. The lifetime control layer 50 is higher in crystal defect density than a surrounding thereof. The lifetime control layer 50 may be higher in crystal defect density than a portion of the drift layer 16 other than the lifetime control layer 50.

The lifetime control layer 50 is formed to improve diode characteristics of the RC-IGBT. The lifetime control layer 50 is a layer with crystal defect induced so that carriers are recombined to suppress a lifetime. The lifetime control layer 50 is formed by irradiation with charged particles, for example. The lifetime control layer 50 is provided in the drift layer 16. Further, in a case where an RC-IGBT surface structure is formed, it is preferable that the lifetime control layer 50 be formed in the diode region 10b only at a portion deeper than the surface structure. The surface structure includes the carrier storing layer 18, the base layer 20, the gate insulating films 22, the gate electrodes 24, the emitter layers 26, the diffusion layers 28, and the insulating layers 39. The lifetime control layer 50 may be formed near a lower end of the gate electrode 24, that is, in a vicinity of an interface relative to the anode.

A crystal defect layer is provided in the ineffective region 10d. The crystal defect layer includes a first crystal defect layer 51 provided in the first measurement layer 31 and a second crystal defect layer 52 provided right under the second measurement layer 32. That is, the crystal defect layer is provided in the first measurement layer 31 but not in the second measurement layer 32. Further, the first crystal defect layer 51 and the second crystal defect layer 52 are each provided between the plurality of measurement electrodes 44 as viewed from a direction orthogonal to the upper surface of the semiconductor substrate 10.

The first crystal defect layer 51 and the second crystal defect layer 52 are each higher in crystal defect density than a surrounding thereof. The first crystal defect layer 51 may be higher in crystal defect density than a portion of the first measurement layer 31 other than the first crystal defect layer 51. The second crystal defect layer 52 may be higher in crystal defect density than a portion of the drift layer 16 other than the second crystal defect layer 52. The first crystal defect layer 51 and the second crystal defect layer 52 are formed by the same process as the lifetime control layer 50 as described later. The first crystal defect layer 51 and the second crystal defect layer 52 are provided above the lifetime control layer 50.

Figure 2:
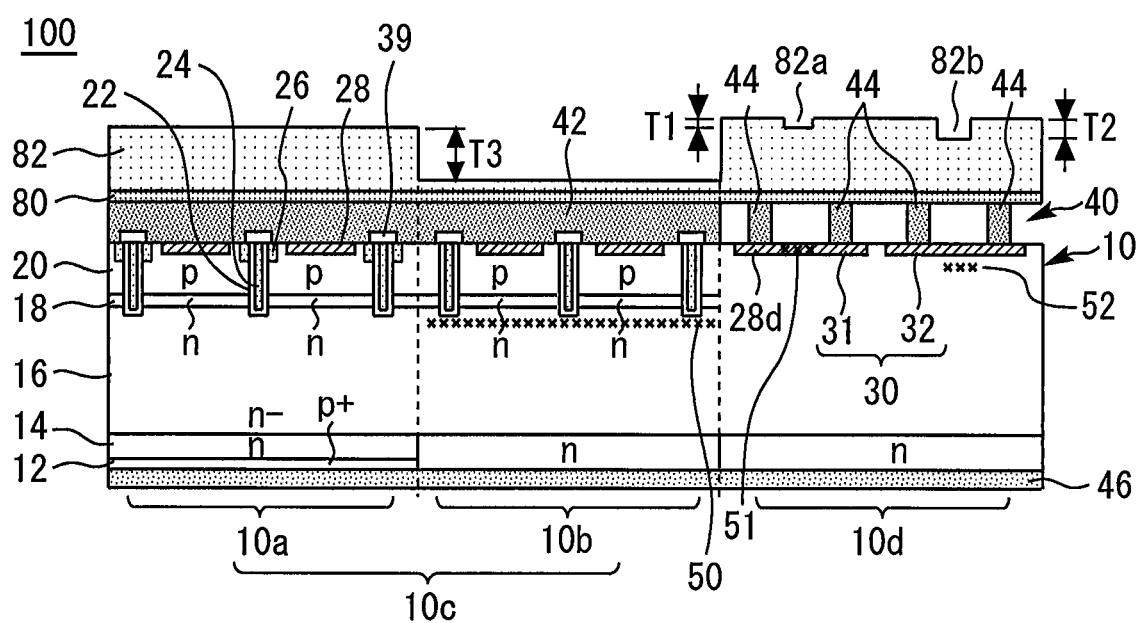
FIG. 2 is a cross-sectional view explaining the method for manufacturing the semiconductor device according to the first embodiment.

Next, a method for manufacturing the semiconductor device 100 will be described. FIG. 2 is a cross-sectional view explaining the method for manufacturing the semiconductor device 100 according to the first embodiment. First, the effective region 10c and the ineffective region 10d, in which the measurement layer 30 is formed at the upper surface side, are formed in the semiconductor substrate 10. Subsequently, the upper surface electrode layer 40 is formed on the upper surface of the semiconductor substrate 10. At this time, the plurality of measurement electrodes 44 are formed on the measurement layer 30.

Subsequently, resistance values between the measurement electrodes 44 are measured. At this time, a resistance value between the measurement electrodes 44 on the first measurement layer 31 and a resistance value between the measurement electrodes 44 on the second measurement layer 32 are measured. By doing so, a resistance value of each of the first measurement layer 31 and the second measurement layer 32 before proton irradiation is obtained. Here, the resistance value being measured is, for example, a sheet resistance of each of the first measurement layer 31 and the second measurement layer 32. Alternatively, a current value of each of the first measurement layer 31 and the second measurement layer 32 before the proton irradiation may be measured.

Subsequently, a mask 82 is formed on the upper surface electrode layer 40. The mask 82 is an irradiation mask for the proton irradiation. Here, a shield 80 has been provided between the upper surface electrode layer 40 and the mask 82. The shield 80 is also referred to as an absorber. The shield 80 adjusts a proton range.

A region where a crystal defect is to be induced by the proton irradiation is formed at a shallower position in the semiconductor substrate 10 with an increase in a thickness of the mask 82. For this reason, the mask 82 is formed thin on the diode region 10b, in which the lifetime control layer 50 is to be formed in the drift layer 16 below the surface structure. Meanwhile, the mask 82 is formed thick on the ineffective region 10d, in which the crystal defect layer is to be formed at a position closer to the upper surface of the semiconductor substrate 10 than the lifetime control layer 50. That is, a height of the mask 82 from the upper surface of the semiconductor substrate 10 is higher on the measurement layer 30 than on the diode region 10b. Likewise, the mask 82 is formed thick on the IGBT region 10a, in which no lifetime control layer 50 is formed.

A difference T3 in the thickness of the mask 82 between the IGBT region 10a and the diode region 10b is set to allow the lifetime control layer 50 to be formed at a target depth in the diode region 10b and no lifetime control layer 50 to be formed in the IGBT region.

Further, the mask 82 is provided with a recessed portion 82a at a position right above the first crystal defect layer 51 and a recessed portion 82b at a position right above the second crystal defect layer 52. The recessed portion 82a has a depth T1 and the recessed portion 82b has a depth T2 larger than T1. A difference T3−T1 in the thickness of the mask 82 is set to allow the first crystal defect layer 51 to be formed in the first measurement layer 31 when the lifetime control layer 50 is formed at the target depth. Further, a difference T2−T1 in the thickness of the mask 82 is set to allow the second crystal defect layer 52 to be formed below the second measurement layer 32 when the first crystal defect layer 51 is formed in the first measurement layer 31.

Subsequently, the proton irradiation is performed from above the mask 82. The irradiated protons destroy a crystal in the semiconductor substrate 10. This induces crystal defect. At this time, the lifetime control layer 50 is formed in the diode region 10b. In addition, the first crystal defect layer 51 and the second crystal defect layer 52 are formed respectively at positions overlapping the recessed portions 82a and 82b as viewed from the direction orthogonal to the upper surface of the semiconductor substrate 10. That is, the crystal defect layer is formed between the plurality of measurement electrodes 44 as viewed from the direction orthogonal to the upper surface of the semiconductor substrate 10.

As described above, in the present embodiment, the uneven mask 82 is used to change a depth of the proton irradiation in accordance with position. This allows the lifetime control layer 50, which is supposed to be formed at a portion deeper than the surface structure, to be formed near a surface of the semiconductor substrate 10 as the first crystal defect layer 51 and the second crystal defect layer 52.

Further, the difference T2−T1 in depth between the recessed portions 82a and 82b allows the first crystal defect layer 51 to be formed in the first measurement layer 31 and the second crystal defect layer 52 to be formed below the second measurement layer 32. That is, the second crystal defect layer 52 is formed at a position deeper than the first crystal defect layer 51.

Subsequently, the mask 82 is removed. Subsequently, resistance values between the plurality of measurement electrodes 44 are measured. By doing so, a resistance value of each of the first measurement layer 31 and the second measurement layer 32 after the proton irradiation is obtained. Alternatively, a current value of each of the first measurement layer 31 and the second measurement layer 32 after the proton irradiation may be measured.

Subsequently, the depth of the lifetime control layer 50 is determined. A method of determining the depth of the lifetime control layer 50 will be described with reference to FIGS. 2 and 3. First, the resistance values between the plurality of measurement electrodes 44 before the proton irradiation are compared with the resistance values after the proton irradiation. FIG. 2 shows a state where the lifetime control layer 50 has been successfully formed at the target depth. At this time, the crystal defect layer is formed in the first measurement layer 31, whereas no crystal defect layer is formed in the second measurement layer 32. Consequently, in comparing the resistance values of each of the first measurement layer 31 and the second measurement layer 32 before and after the proton irradiation, a measurement value of the first measurement layer 31 varies, whereas a measurement value of the second measurement layer 32 does not vary.

Figure 3:
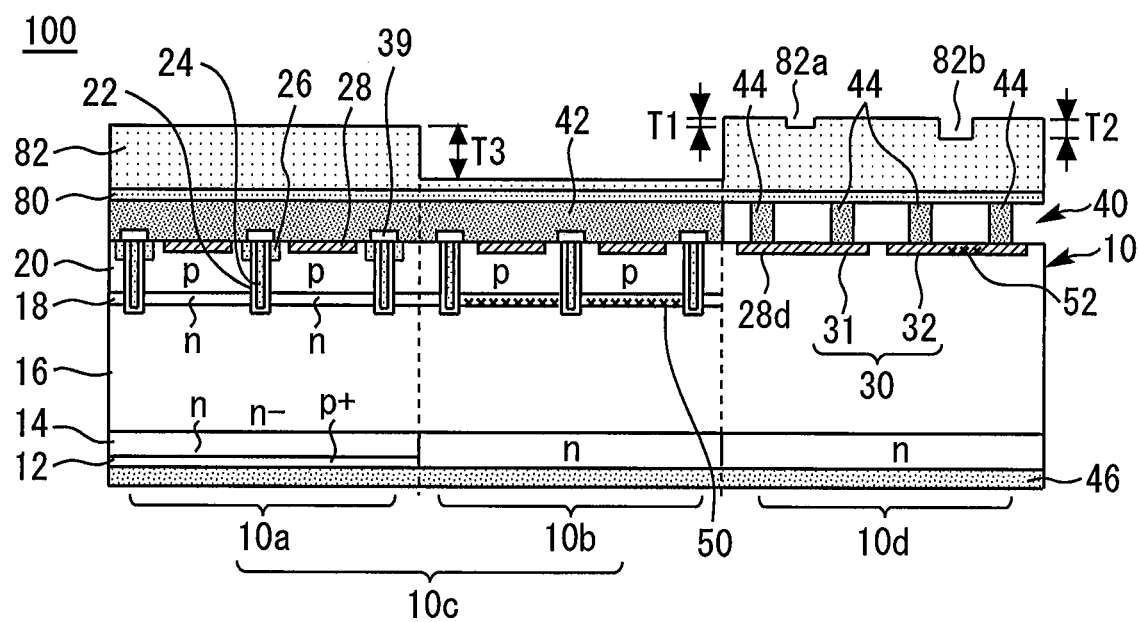
FIG. 3 is a diagram showing a state where the lifetime control layer has been formed shallower than the target depth.

FIG. 3 is a diagram showing a state where the lifetime control layer 50 has been formed shallower than the target depth. At this time, the lifetime control layer 50 is formed in the carrier storing layer 18, for example. Further, in the ineffective region 10d, the crystal defect layer is also formed at a shallower position than in a case shown in FIG. 2. Thus, no first crystal defect layer 51 is formed in the semiconductor substrate 10. Further, the second crystal defect layer 52 is formed in the second measurement layer 32, for example. Consequently, in comparing the resistance values of each of the first measurement layer 31 and the second measurement layer 32 before and after the proton irradiation, the measurement value of the first measurement layer 31 does not vary, whereas the measurement value of the second measurement layer 32 varies.

Meanwhile, in a case where the lifetime control layer 50 has been formed deeper than the target depth, the crystal defect layer is also formed at a deeper position than in the case shown in FIG. 2 in the ineffective region 10d. The first crystal defect layer 51 and the second crystal defect layer 52 are thus formed in the drift layer 16. That is, no crystal defect layer is formed in either first measurement layer 31 or the second measurement layer 32. Consequently, in comparing the resistance values of each of the first measurement layer 31 and the second measurement layer 32 before and after the proton irradiation, neither the measurement value of the first measurement layer 31 nor the measurement value of the second measurement layer 32 varies.

That is, if the measurement value of the first measurement layer 31 varies, the lifetime control layer 50 is determined to be formed at the target depth. Further, if the measurement value of the second measurement layer 32 varies, the lifetime control layer 50 is determined to be formed shallower than the target depth. Further, if neither the measurement value of the first measurement layer 31 nor the measurement value of the second measurement layer 32 varies, the lifetime control layer 50 is determined to be formed deeper than the target depth.

Feedback to proton irradiation conditions or in-process screening for devices is performed in accordance with a determination result of the depth of the lifetime control layer 50. In the present embodiment, it is thus possible to check whether or not the lifetime control layer 50 has been successfully formed at the target depth simply by measuring the resistance values or the current values before and after the proton irradiation.

Subsequently, the rear surface electrode layer 46 is formed on the rear surface of the semiconductor substrate 10. It should be noted that the rear surface electrode layer 46 may be formed before the formation of the lifetime control layer 50.

In the present embodiment, the accuracy of the depth of proton irradiation from a wafer surface can be easily controlled as described above. In addition, since the depth of the lifetime control layer 50 can be determined immediately after the proton irradiation, the determination result can be promptly fed back. Therefore, the in-process screening for devices and feedback to the irradiation conditions can be easily performed.

Further, the resistance values or the current values are measured immediately before and after the proton irradiation in the present embodiment. This allows for determining only an influence of the proton irradiation. Therefore, evaluation accuracy can be improved.

According to a modification example of the present embodiment, the lifetime control layer 50 may be formed in the IGBT region 10a. Further, the semiconductor device 100 may be a vertical semiconductor device such as an IGBT or a diode instead of the RC-IGBT and a process of the proton irradiation may be included in a production process.

Further, the lifetime control layer 50 may be formed by, instead of the proton irradiation, helium particle irradiation, electron beam irradiation, or the like.

Further, a thickness of the measurement layer 30 is the same as that of the diffusion layer 28 in the present embodiment. The present invention is not limited thereto, and a thickness of the first measurement layer 31 may be set to allow, when the depth of irradiation is within a target range, the first crystal defect layer 51 to be formed in the first measurement layer 31 and, when the depth of irradiation is out of the target range, the first crystal defect layer 51 not to be formed in the first measurement layer 31. Further, the conducting layer 28d is not necessarily the same as the diffusion layer 28 but may be any layer where the resistance values or the current values can be measured using the measurement electrodes 44.

Further, the semiconductor device 100 may include only one of either the first measurement layer 31 or the second measurement layer 32. For example, in a case where only the first measurement layer 31 is provided as the measurement layer 30, it is possible to determine whether or not the lifetime control layer 50 is formed at the target depth in accordance with whether or not the resistance value of the first measurement layer 31 varies.

Further, in a case where a resistance value resulting from a crystal defect layer being formed in the measurement layer 30 or a resistance value resulting from no crystal defect layer being formed in the measurement layer 30 is known in advance, the resistance value may be measured only after the proton irradiation. In this case, it is possible to determine whether or not the lifetime control layer 50 is formed at the target depth by comparing the measurement value with the resistance value that is known in advance.

Further, the semiconductor substrate 10 may be made with a wide band gap semiconductor. The wide band gap semiconductor may be silicon carbide, gallium nitride material, or diamond, for example. This allows for improving voltage resistance and allowable current density of the semiconductor device 100 and downsizing the semiconductor device 100. Therefore, the ineffective region 10d as described in the present embodiment can be ensured.

Figure 4:
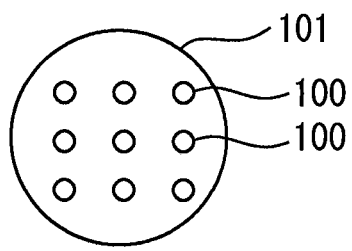
FIG. 4 is a plan view of a semiconductor wafer according to a modification example of the first embodiment.

FIG. 4 is a plan view of a semiconductor wafer 101 according to a modification example of the first embodiment. The semiconductor wafer 101 is provided with a plurality of semiconductor devices 100. That is, of chips formed on the semiconductor wafer 101, the semiconductor devices 100, which are measurement points, are arranged as shown in FIG. 4, for example. By arranging the plurality of measurement points on the semiconductor wafer 101, it is possible to find an in-plane-of-wafer variation in the depth of proton irradiation. This makes it possible to provide more detailed feedback to the proton irradiation conditions.

The number and arrangement of the measurement points formed on the semiconductor wafer 101 may be changed in accordance with required accuracy of control of the depth of proton irradiation. It should be noted that the measurement points may be arranged corresponding one-to-one to the chips formed on the semiconductor wafer 101. This makes it possible to associate characteristics of each of the chips with a variation in the proton irradiation.

These modifications can be applied, as appropriate, to a semiconductor device, a semiconductor wafer and a method for manufacturing a semiconductor device according to the following embodiments. Note that the semiconductor device, the semiconductor wafer, and the method for manufacturing the semiconductor device according to the following embodiments are similar to those of the first embodiment in many respects, and thus differences between the semiconductor device, the semiconductor wafer and the method for manufacturing the semiconductor device according to the following embodiments and those of the first embodiment will be mainly described below.

Second Embodiment

Figure 5:
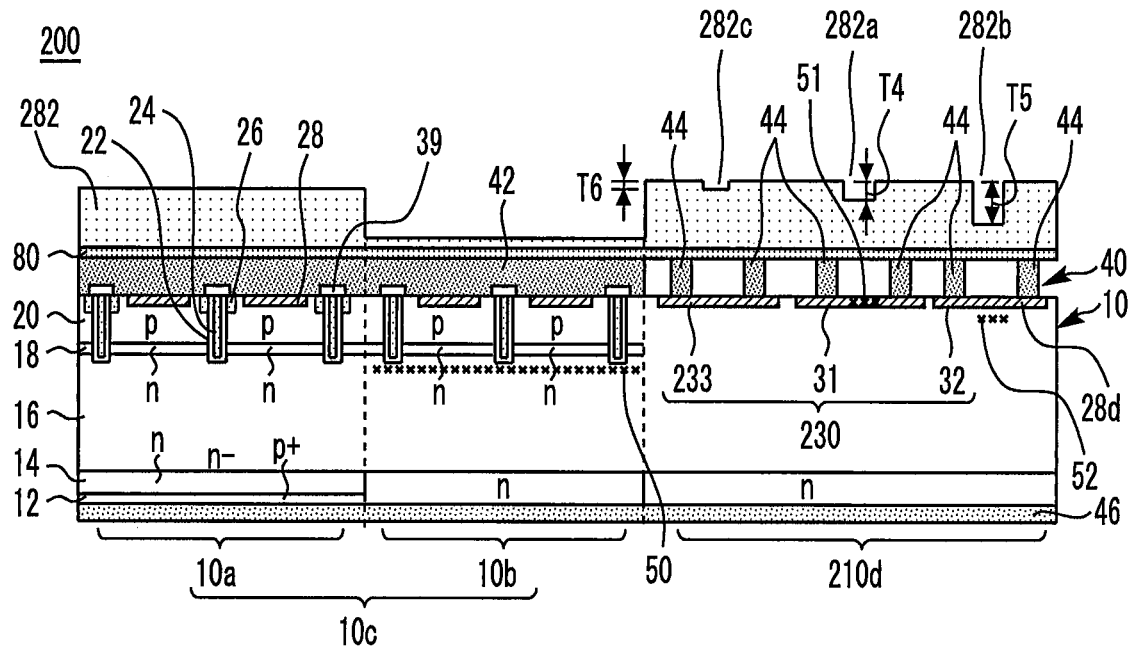
FIG. 5 is a cross-sectional view of a semiconductor device according to the second embodiment.

FIG. 5 is a cross-sectional view of a semiconductor device 200 according to the second embodiment. The semiconductor device 200 is different in a structure of an ineffective region 210d from the first embodiment. Except for this, the second embodiment is similar to the first embodiment. It should be noted that a shield 80 and a mask 282 used for the production process are shown in FIG. 5 for convenience.

A measurement layer 230 is provided at an upper surface side of the ineffective region 210d. The measurement layer 230 includes the first measurement layer 31, the second measurement layer 32, and a third measurement layer 233. Further, each of the first measurement layer 31, the second measurement layer 32, and the third measurement layer 233 is the conducting layer 28d.

A crystal defect layer provided in the ineffective region 210d includes the first crystal defect layer 51 provided in the first measurement layer 31 and the second crystal defect layer 52 provided right under the second measurement layer 32. No crystal defect layer is provided in the third measurement layer 233 or right under the third measurement layer 233.

Next, a method for manufacturing the semiconductor device 200 will be described. In the present embodiment, resistance values between the measurement electrodes 44 on the first measurement layer 31, the second measurement layer 32, and the third measurement layer 233 are measured after the formation of the upper surface electrode layer 40. By doing so, resistance values of the first measurement layer 31, the second measurement layer 32, and the third measurement layer 233 before the proton irradiation are obtained.

Subsequently, the mask 282 is formed on the upper surface electrode layer 40. The mask 282 is provided with a recessed portion 282a at a position right above the first crystal defect layer 51 and a recessed portion 282b at a position right above the second crystal defect layer 52. In addition, the mask 282 is provided with a recessed portion 282c at a position between the measurement electrodes 44 on the third measurement layer 233 as viewed from the direction orthogonal to the upper surface of the semiconductor substrate 10.

The recessed portion 282a has a depth T4 and the recessed portion 282b has a depth T5 larger than T4. Meanwhile, the recessed portion 282c has a depth T6 smaller than T4. The depths T4 and T5 are determined in a manner similar to that of the depths T1 and T2 in the first embodiment. Further, a difference T4−T6 in a thickness of the mask 282 is set to allow, when the first crystal defect layer 51 is formed in the first measurement layer 31, the depth of proton irradiation to a position overlapping the recessed portion 282c to be shallower than the upper surface of the semiconductor substrate 10.

Subsequently, the proton irradiation is performed from above the mask 282. By doing so, the lifetime control layer 50 is formed in the diode region 10b as in the first embodiment. Further, the first crystal defect layer 51 is formed in the first measurement layer 31 and the second crystal defect layer 52 is formed below the second measurement layer 32. Further, the difference T4−T6 between the depths of the recessed portions 282a and 282c allows no crystal defect layer to be formed either in the third measurement layer 233 or right under the third measurement layer 233.

Subsequently, the mask 282 is removed and resistance values between the plurality of measurement electrodes 44 are measured. By doing so, the resistance values of the first measurement layer 31, the second measurement layer 32, and the third measurement layer 233 after the proton irradiation are obtained.

Subsequently, the depth of the lifetime control layer 50 is determined. Here, the resistance values between the plurality of measurement electrodes 44 before the proton irradiation are compared with the resistance values after the proton irradiation as in the first embodiment. FIG. 5 shows a state where the lifetime control layer 50 has been successfully formed at the target depth. In this case, in comparing the resistance values of each of the first measurement layer 31 and the second measurement layer 32 before and after the proton irradiation, the measurement value of the first measurement layer 31 varies, whereas the measurement value of the second measurement layer 32 does not vary as in the first embodiment. Meanwhile, since no crystal defect layer is formed in the third measurement layer 233 before and after the measurement, a measurement value of the third measurement layer 233 does not vary.

Next, a case where the lifetime control layer 50 is formed shallower than the target depth is considered. In this case, the lifetime control layer 50 is formed in the carrier storing layer 18, for example. In addition, a crystal defect layer is formed only in the second measurement layer 32. Consequently, measurement values of the first measurement layer 31 and the third measurement layer 233 do not vary before and after the proton irradiation, whereas the measurement value of the second measurement layer 32 varies.

Further, a case where the lifetime control layer 50 is formed deeper than the target depth is considered. In this case, a crystal defect layer is formed in neither the first measurement layer 31 nor the second measurement layer 32 but in the third measurement layer 233. Consequently, in comparing resistance values before and after the proton irradiation, the measurement values of the first measurement layer 31 and the second measurement layer 32 do not vary, whereas the measurement value of the third measurement layer 233 varies.

That is, if the measurement value of the first measurement layer 31 varies, the lifetime control layer 50 is determined to be formed at the target depth. Further, if the measurement value of the second measurement layer 32 varies, the lifetime control layer 50 is determined to be formed shallower than the target depth. Further, if the measurement value of the third measurement layer 233 varies, the lifetime control layer 50 is determined to be formed deeper than the target depth.

In the present embodiment, it is possible to easily determine whether a depth of the lifetime control layer 50 is deeper or shallower than the target depth. In particular, if the lifetime control layer 50 is formed deeper than the target depth, the measurement value of the third measurement layer 233 varies, allowing for more accurately determining the depth of irradiation.

In this regard, there is a possibility that the measurement values of the two or more of the first to third measurement layers 31, 32, and 233 vary before and after the proton irradiation. In this case, the depth of the lifetime control layer 50 may be determined from a measurement layer with the largest variation between the measurement values before and after the proton irradiation. Further, in a case where the measurement values of the first measurement layer 31 and the second measurement layer 32 both vary, for example, the lifetime control layer 50 can be determined to be provided in a middle between the positions shown in FIG. 2 and FIG. 3.

In the present embodiment, the three measurement layers 30 are provided in the ineffective region 210d. The present invention is not limited thereto and four or more measurement layers 30 may be provided in the ineffective region 210d. In this case, the measurement layers 30 can be used not only merely for determining whether or not inspection criteria are passed but also for examining the depth of the lifetime control layer 50 in detail.

Third Embodiment

Figure 6:
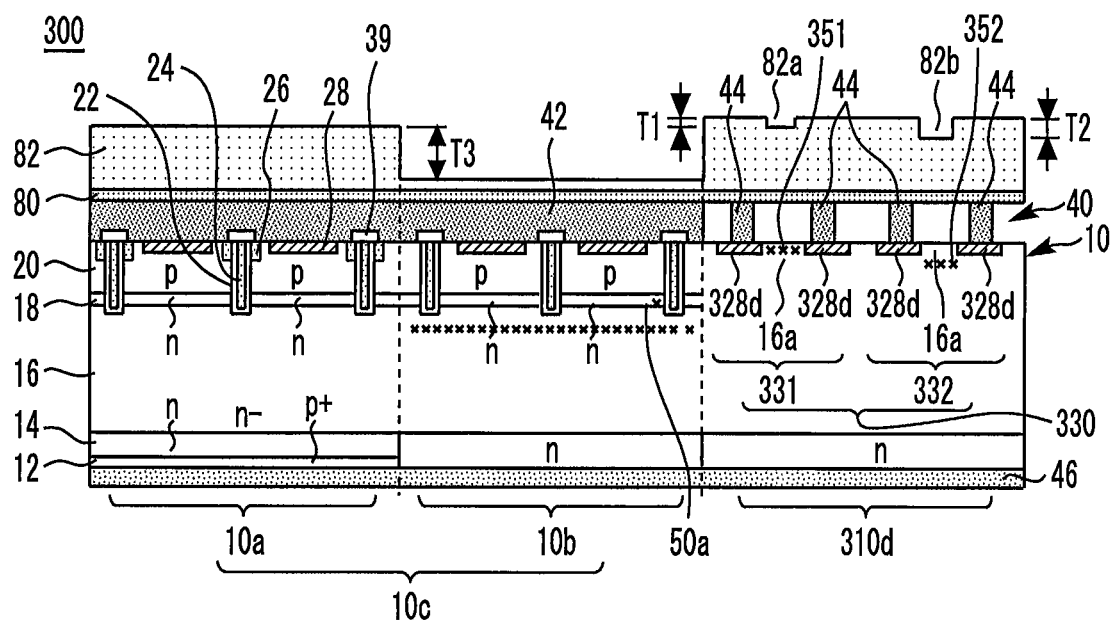
FIG. 6 is a cross-sectional view of a semiconductor device according to the third embodiment.

FIG. 6 is a cross-sectional view of a semiconductor device 300 according to the third embodiment. The present embodiment is different in a structure of a measurement layer 330 from the first embodiment. Except for this, the present embodiment is similar to the first embodiment. The measurement layer 330 includes a first measurement layer 331 and a second measurement layer 332. There are provided p-type conducting layers 328d at the upper surface side of the drift layer 16 in the ineffective region 310d. The first measurement layer 331 includes ones of the conducting layers 328d provided at both ends thereof and a portion 16a of the drift layer 16 sandwiched between the ones of the conducting layers 328d. Similarly, the second measurement layer 332 includes ones of the conducting layers 328d provided at both ends thereof and a portion 16a of the drift layer 16 sandwiched between the ones of the conducting layers 328d.

Further, a first crystal defect layer 351 is formed in the first measurement layer 331 as in the first embodiment. The first crystal defect layer 351 is formed at the portion 16a sandwiched between the conducting layers 328d of the first measurement layer 331. Meanwhile, a second crystal defect layer 352 is formed right under the second measurement layer 332. The second crystal defect layer 352 is formed right under the portion 16a sandwiched between the conducting layers 328d of the second measurement layer 332.

In the first measurement layer 331, the plurality of measurement electrodes 44 are provided on the respective conducting layers 328d at both end portions. Similarly, in the second measurement layer 332, the plurality of measurement electrodes 44 are provided on the respective conducting layers 328d at both end portions.

In the present embodiment, each of the measurement layers 330 is provided with a pnp pattern. A target to be measured using the plurality of measurement electrodes 44 is not a sheet resistance but a leakage current between the measurement electrodes 44. A process of checking whether or not there is a variation between measurement values before and after the proton irradiation is similar to that of the first embodiment. The depth of the lifetime control layer 50 can also be easily determined in the present embodiment.

According to a modification example of the present embodiment, the measurement layer 330 does not necessarily have the structure shown in FIG. 6 but only has to include the conducting layers 328d at least at portions where the plurality of measurement electrodes 44 are provided. For example, the conducting layers 328d may be provided at a portion other than both ends of the measurement layer 330.

Figure 7:
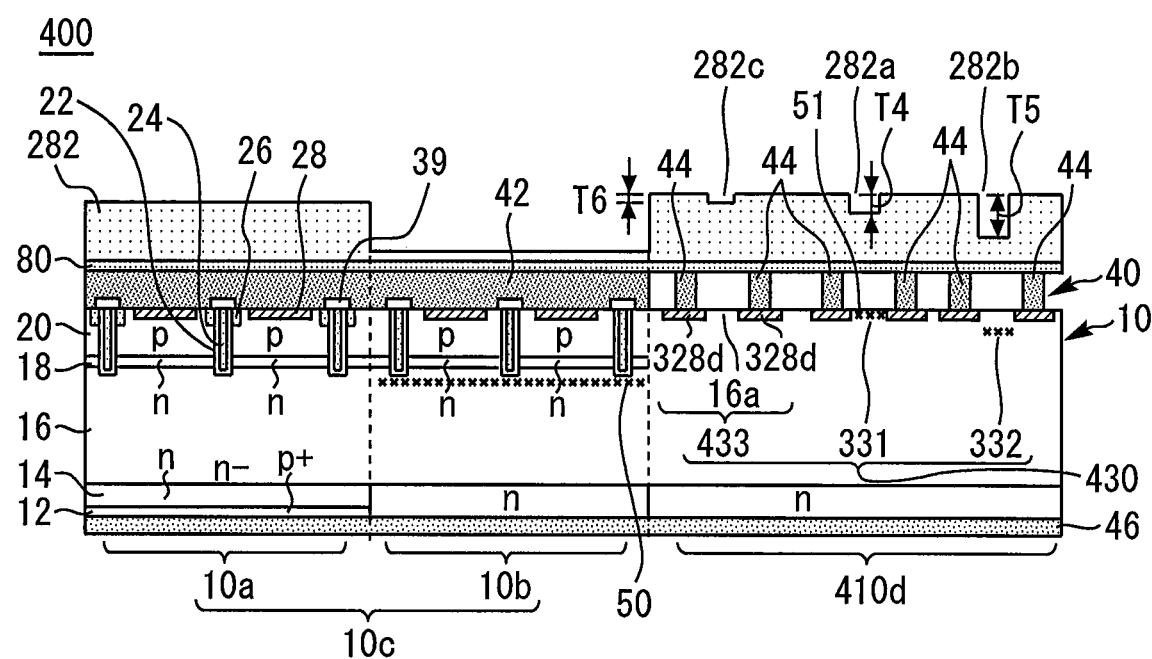
FIG. 7 is a cross-sectional view of a semiconductor device according to a modification example of the third embodiment.

FIG. 7 is a cross-sectional view of a semiconductor device 400 according to a modification example of the third embodiment. A measurement layer 430 is formed in the ineffective region 410d. The measurement layer 430 includes the first measurement layer 331, the second measurement layer 332, and a third measurement layer 433. The third measurement layer 433 includes ones of the conducting layers 328d provided at both ends thereof and a portion 16a of the drift layer 16 sandwiched between the ones of the conducting layers 328d. Meanwhile, no crystal defect layer is provided at a position overlapping the third measurement layer 433.

A process of checking whether or not there is a variation between the measurement values before and after the proton irradiation is similar to that of the second embodiment. The depth of the lifetime control layer 50 can also be easily determined in the semiconductor device 400. Note that the technical features described in the above embodiments may be combined as appropriate.

REFERENCE SIGNS LIST 100, 200, 300, 400 semiconductor device, 101 semiconductor wafer, 10 semiconductor substrate, 10c effective region, 10d, 210d, 310d, 410d ineffective region, 14 buffer layer, 16 drift layer, 20 base layer, 28 diffusion layer, 28d, 328d conducting layer, 30, 230, 330, 430 measurement layer, 31, 331 first measurement layer, 32, 332 second measurement layer, 233, 433 third measurement layer, 40 upper surface electrode layer, 44 measurement electrode, 46 rear surface electrode layer, 50 lifetime control layer, 51 first crystal defect layer, 52 second crystal defect layer, 82, 282 mask

The invention claimed is:
1. A semiconductor device comprising:
a semiconductor substrate having an effective region where principle current is to flow and an ineffective region that surrounds the effective region;
an upper surface electrode layer provided on an upper surface of the semiconductor substrate; and
a rear surface electrode layer provided on a rear surface of the semiconductor substrate, wherein
the semiconductor substrate includes:
a lifetime control layer that is provided in the effective region and higher in crystal defect density than a surrounding thereof;
a measurement layer provided at an upper surface side of the ineffective region; and
a crystal defect layer that is provided in the ineffective region and higher in crystal defect density than a surrounding thereof,
the upper surface electrode layer includes a plurality of measurement electrodes provided on the measurement layer,
the measurement layer includes a conducting layer at least at a portion where the plurality of measurement electrodes are provided, and the crystal defect layer is provided between the plurality of measurement electrodes as viewed from a direction orthogonal to the upper surface of the semiconductor substrate.

2. The semiconductor device according to claim 1, wherein the crystal defect layer is provided above the lifetime control layer.

3. The semiconductor device according to claim 1, wherein the crystal defect layer is provided in the measurement layer.

4. The semiconductor device according to claim 1, wherein
the measurement layer includes a first measurement layer and a second measurement layer, and
the crystal defect layer is provided in the first measurement layer and not in the second measurement layer.

5. The semiconductor device according to claim 1, wherein
the measurement layer includes a first measurement layer and a second measurement layer, and
the crystal defect layer includes a first crystal defect layer provided in the first measurement layer and a second crystal defect layer provided right under the second measurement layer.

6. The semiconductor device according to claim 1, wherein
the measurement layer includes a first measurement layer, a second measurement layer, and a third measurement layer, and
the crystal defect layer includes a first crystal defect layer provided in the first measurement layer and a second crystal defect layer provided right under the second measurement layer.

7. The semiconductor device according to claim 1, wherein
the conducting layer is of a second conductivity type and provided at an upper surface side of a semiconductor layer that is of a first conductivity type, and
the measurement layer includes the conducting layers at both ends thereof and a portion of the semiconductor layer sandwiched between the conducting layers.

8. The semiconductor device according to claim 1, wherein
the semiconductor substrate includes:
a cathode that is of a first conductivity type and provided at a rear surface side;
a drift layer that is of the first conductivity type and provided at an upper surface side; and
an anode that is of a second conductivity type and provided at an upper surface side of the drift layer, and
the lifetime control layer is provided in the drift layer.

9. The semiconductor device according to claim 8, further comprising a diffusion layer that is of the second conductivity type and provided at an upper surface side of the anode, wherein
the conducting layer is a same layer as the diffusion layer.

10. The semiconductor device according to claim 1, wherein the semiconductor substrate is made with a wide band gap semiconductor.

11. The semiconductor device according to claim 10, wherein the wide band gap semiconductor includes silicon carbide, gallium nitride material, or diamond.

12. A semiconductor wafer comprising a plurality of the semiconductor devices according to claim 1.

13. A method for manufacturing a semiconductor device, comprising:
forming, in a semiconductor substrate, an effective region where principle current is to flow and an ineffective region where a measurement layer is formed at an upper surface side thereof, the ineffective region surrounding the effective region;
forming an upper surface electrode layer on an upper surface of the semiconductor substrate by forming a plurality of measurement electrodes on the measurement layer;
forming a rear surface electrode layer on a rear surface of the semiconductor substrate;
forming a mask on the upper surface electrode layer with a height of the mask from the upper surface of the semiconductor substrate on the measurement layer being higher than on the effective region;
performing proton irradiation from above the mask, thereby forming a lifetime control layer in the effective region and forming a crystal defect layer between the plurality of measurement electrodes as viewed from a direction orthogonal to the upper surface of the semiconductor substrate; and
removing the mask and measuring a resistance value between the plurality of measurement electrodes after the proton irradiation;
wherein a conducting layer is formed in the measurement layer at least at a portion where the plurality of measurement electrodes are provided.

14. The method for manufacturing a semiconductor device according to claim 13, further comprising:
measuring, prior to the forming of the mask, a resistance value between the plurality of measurement electrodes before the proton irradiation; and
comparing the resistance value between the plurality of measurement electrodes before the proton irradiation and the resistance value after the proton irradiation.

* * * * *